(12) United States Patent
Kuo

(10) Patent No.: US 9,419,656 B2
(45) Date of Patent: Aug. 16, 2016

(54) DECODER AND METHOD FOR DECODING AN ENCODED SEQUENCE OF BITS

(71) Applicant: Intel IP Corporation, Santa Clara, CA (US)

(72) Inventor: Chun-Hsuan Kuo, San Diego, CA (US)

(73) Assignee: Intel IP Corporation, Santa Clara, CA (US)

( * ) Notice: Subject to any disclaimer, the term of this patent is extended or adjusted under 35 U.S.C. 154(b) by 79 days.

(21) Appl. No.: 14/445,146

(22) Filed: Jul. 29, 2014

(65) Prior Publication Data

US 2016/0036465 A1    Feb. 4, 2016

(51) Int. Cl.
*H03M 13/03*    (2006.01)
*H03M 13/39*    (2006.01)
*H03M 13/41*    (2006.01)
*H03M 13/00*    (2006.01)

(52) U.S. Cl.
CPC ........ *H03M 13/3938* (2013.01); *H03M 13/413* (2013.01); *H03M 13/6525* (2013.01)

(58) Field of Classification Search
CPC .......... H03M 13/256; H03M 13/4115; H03M 13/3738; H03M 13/09; H03M 13/3961; H03M 13/4123; H03M 13/413; H03M 13/4146; H03M 13/4169; H03M 13/4107; H03M 13/6583; H03M 13/4176; H03M 13/451; H03M 13/3994; H04L 1/0054; H04L 1/006; H04L 1/0061

See application file for complete search history.

(56) References Cited

U.S. PATENT DOCUMENTS 5,878,098 A * 3/1999 Wang ................ H03M 13/3961
 375/340
6,452,985 B1 * 9/2002 Hatakeyama ..... H03M 13/3961
 375/262

(Continued)

*Primary Examiner* — Guerrier Merant
(74) *Attorney, Agent, or Firm* — Schiff Hardin LLP

(57) ABSTRACT

A decoder including an input, a branch metric unit, a path metric unit, a starting state unit, and a tail path forcing unit, or alternatively, a state consistency unit. The input is configured to receive a encoded sequence of bits. The branch metric unit is configured to determine a plurality of branch metrics for a plurality of respective transitions between a plurality of states in a trellis representation of a code used to generate the encoded sequence of bits. The path metric unit is configured to determine, based on the plurality of branch metrics, path metrics corresponding to a plurality of maximum likelihood survival paths reaching the plurality of respective states in the trellis representation. The starting state unit is configured to store a plurality of starting states for the respective maximum likelihood survival paths. The tail path forcing unit is configured to select a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one. The state consistency unit is configured to determine whether a maximum likelihood survival path has an ending state in the trellis representation that is equivalent to its stored starting state, wherein if the state consistency unit's determination is positive, the branch metric unit and path metric unit are configured to end the determinations of the branch and path metrics.

12 Claims, 8 Drawing Sheets

(56) References Cited

U.S. PATENT DOCUMENTS

| | | | | |
|---|---|---|---|---|
| 6,748,034 B2* | 6/2004 | Hattori | H03M 13/4107 | 375/262 |
| 7,046,746 B1* | 5/2006 | Keaney | H03M 13/3961 | 375/265 |
| 2002/0010895 A1* | 1/2002 | Mujtaba | H03M 13/3961 | 714/795 |
| 2005/0094748 A1* | 5/2005 | Zaboronski | H03M 13/395 | 375/341 |
| 2007/0168843 A1* | 7/2007 | Kanaoka | G11B 20/10009 | 714/792 |
| 2007/0245209 A1* | 10/2007 | Shi | H03M 13/3938 | 714/755 |
| 2008/0109710 A1* | 5/2008 | Takanashi | H03M 13/4115 | 714/799 |
| 2011/0211659 A1* | 9/2011 | Kosakowski | H03M 13/413 | 375/341 |
| 2013/0114766 A1* | 5/2013 | Mueller-Weinfurtner | H03M 13/3994 | 375/341 |
| 2013/0124947 A1* | 5/2013 | Lane | H03M 13/413 | 714/786 |

\* cited by examiner

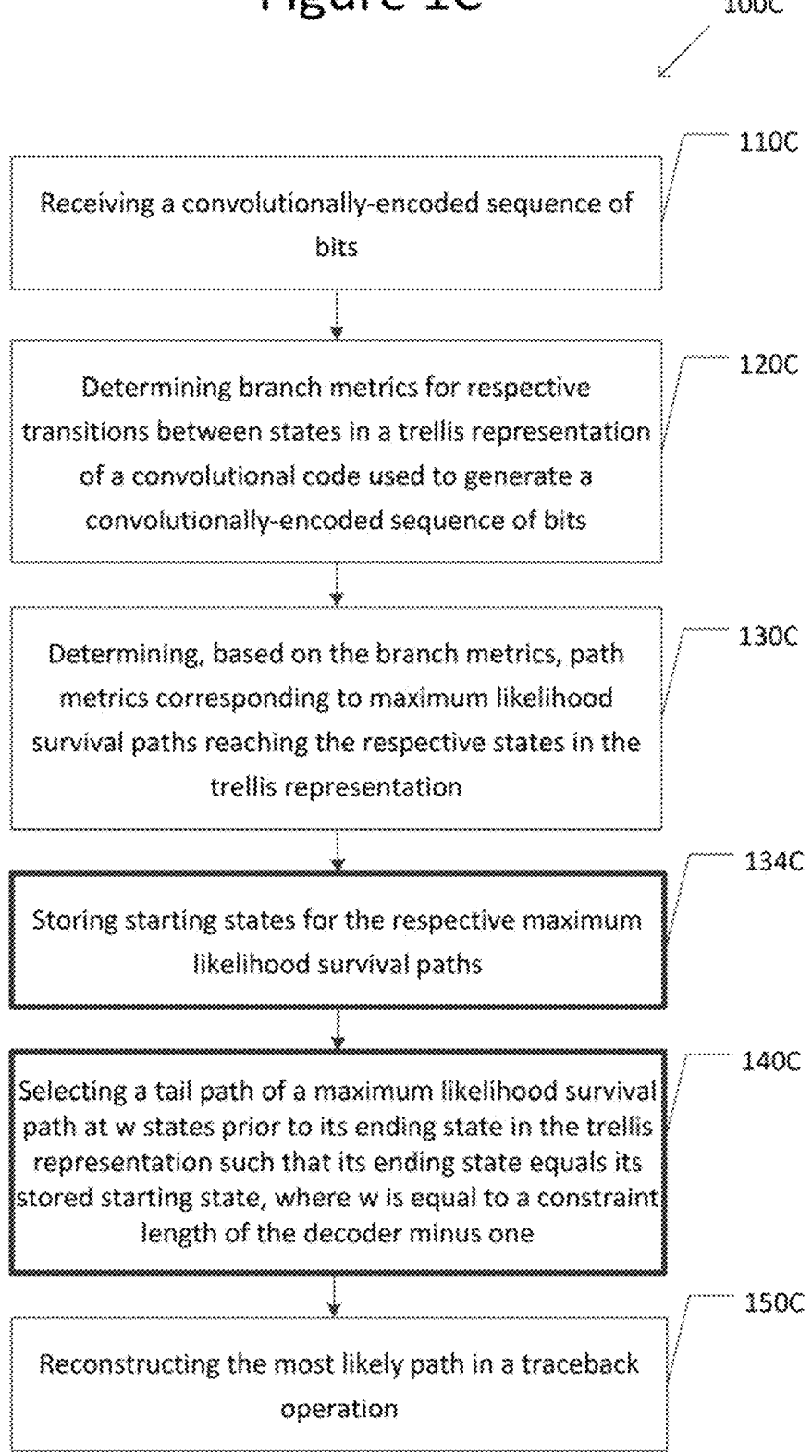

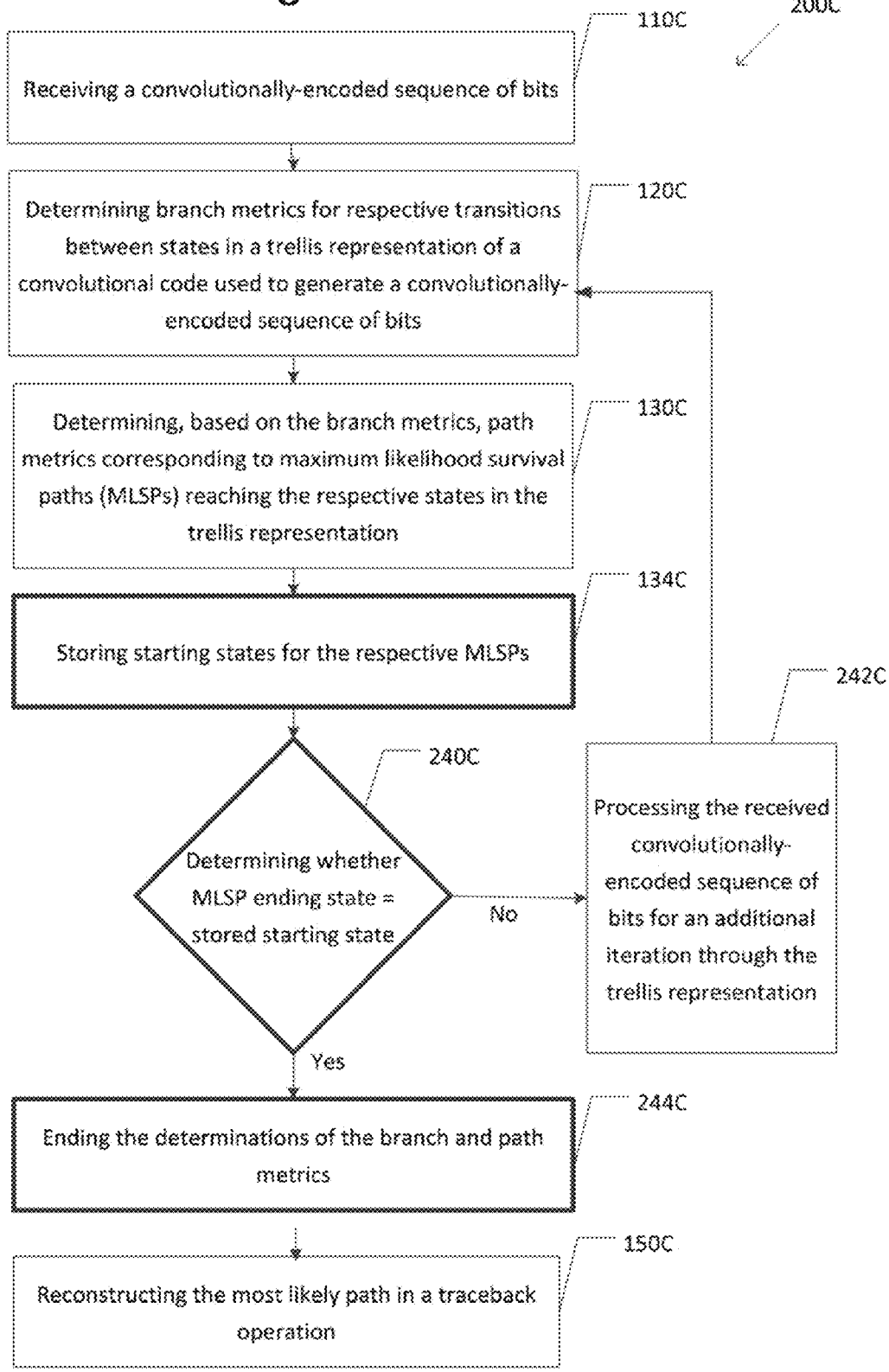

US 9,419,656 B2

DECODER AND METHOD FOR DECODING AN ENCODED SEQUENCE OF BITS

TECHNICAL FIELD

The present disclosure generally relates to a decoder and a method for decoding an encoded sequence of bits.

BACKGROUND

Channel coding is commonly used to increase the robustness of a digital communication system. The principle underlying channel coding is to introduce redundancy into the transmitted bit stream so as to facilitate error detection and correction at the decoder. One general class of channel codes is trellis codes, and a commonly-used class of trellis codes is known as convolutional codes. Convolutional codes are used extensively in numerous applications in order to achieve reliable data transfer, including digital video, radio, mobile communication, and satellite communication.

According to a mobile communication standard, such as the 3rd Generation Partnership Project (3GPP) specification for Long Term Evolution (LTE), the Physical Downlink Control Channel (PDCCH) is encoded by a rate 1/3 tail biting convolutional code (TBCC), followed by a rate matching unit that produces the final coding rate ranging from 0.04 to 0.99. The rate is defined as m/n, where each m-bit information symbol to be encoded is transformed into an n-bit symbol. Due to this requirement, the user equipment needs to have a TBCC decoder that can perform PDCCH decoding across all supported code rates. This requirement is challenging since the decoder needs to address at least the following three criteria: (i) reasonably good decoding performance; (ii) acceptable decoding complexity for all code rates; and (iii) required timing budget per the 3GPP for all code rates. These criteria are particularly difficult to achieve for the decoding of high code rate TBCC, e.g., having a code rate of 71/72. A convolutional decoder is needed which has acceptable decoding complexity and is within the required timing budget per 3GPP for all code rates, but without sacrificing decoding performance.

BRIEF DESCRIPTION OF THE DRAWINGS

FIG. 1C is a flowchart illustrating an example of a method of decoding a convolutionally-encoded sequence of bits using the decoder of FIG. 1A.

DETAILED DESCRIPTION

This disclosure is directed to a decoder including a starting state unit configured to store starting states for the respective maximum likelihood survival paths though a trellis representation of a code, and a path forcing unit configured to select a tail path of a maximum likelihood survival path at w states prior to its ending state in the trellis representation such that its ending state equals its stored starting state, where w is equal to a constraint length of the decoder minus one. As an alternative or in addition to the tail path forcing unit, the decoder may have a state consistency unit configured to determine whether a maximum likelihood survival path has an ending state in the trellis representation that is equivalent to its stored starting state, and if so, ending the decoding process.

Figure 4:
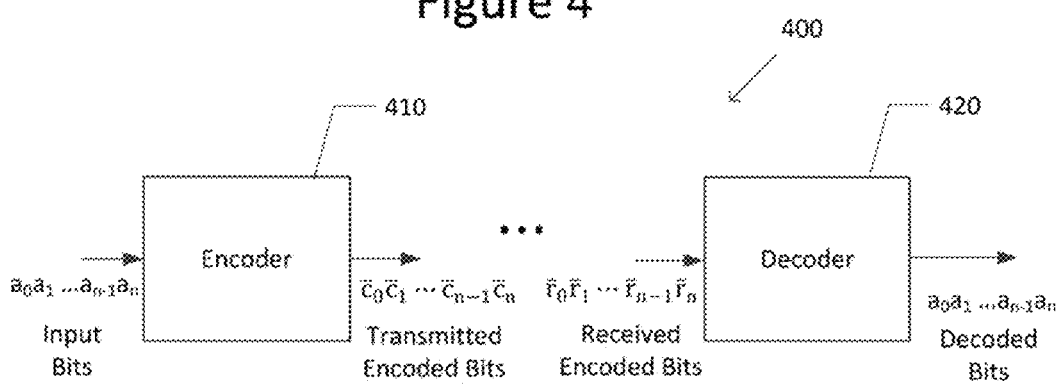
FIG. 4 illustrates a schematic diagram of a system including a convolutional encoder and decoder.

FIG. 4, by way of overview, illustrates a schematic diagram of a system 400 including a convolutional encoder 410 and decoder 420. Output code words, that is, encoded bits, $[\bar{c}_0 \bar{c}_1 \ldots \bar{c}_{n-1} \bar{c}_n]$ result from the convolution of a sequence of input bits $[a_0 a_1 \ldots a_{n-1} a_n]$ with the impulse response of the encoder 410 which includes a v-stage shift register (not shown). A sequence of n bits, that is, an n-bit code word, $[\bar{c}_0 \bar{c}_1 \ldots \bar{c}_{n-1} \bar{c}_n]$ is generated as a function of m input bits $[a_0 a_1 \ldots a_{n-1} a_n]$ and v bits stored in the shift register. The constraint length L of the encoder 410 is defined as m+v, and the rate of the code is given by m/n, where n>m. The transmitted convolutionally-encoded sequence of bits or code word $[\bar{c}_0 \bar{c}_1 \ldots \bar{c}_{n-1} \bar{c}_n]$ is received at decoder 420 as $[\bar{r}_0 \bar{r}_1 \ldots \bar{r}_{n-1} \bar{r}_n]$. Ideally the sequence of encoded bits $[\bar{c}_0 \bar{c}_1 \ldots \bar{c}_{n-1} \bar{c}_n]$ transmitted by the encoder 410 is the same as the encoded bits $[\bar{r}_0 \bar{r}_1 \ldots \bar{r}_{n-1} \bar{r}_n]$ received at the decoder, but in reality there are generally transmission errors. To decode the convolutional code back to the original sequence of input bits $[a_0 a_1 \ldots a_{n-1} a_n]$, Viterbi algorithm is most frequently used, however, other algorithms, such as Fano algorithm, are alternatives.

Figure 1A:
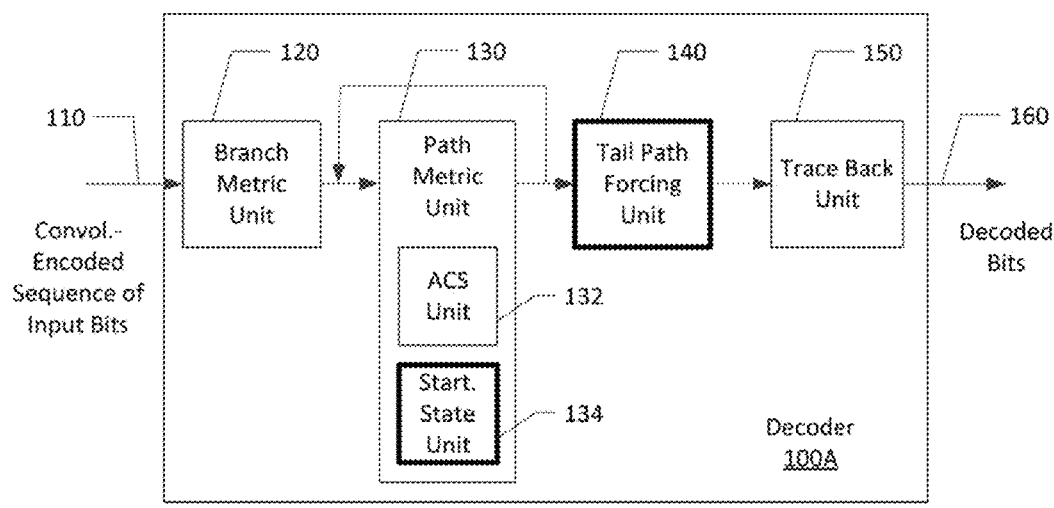
FIG. 1A illustrates a schematic diagram of an example of a convolutional decoder.

FIG. 1A illustrates a schematic diagram of an example of a convolutional decoder 100A. The convolutional decoder 100A includes an input 110, a branch metric unit 120, a path metric unit 130, a tail path forcing unit 140, and a trace back unit 150.

Figure 1B:
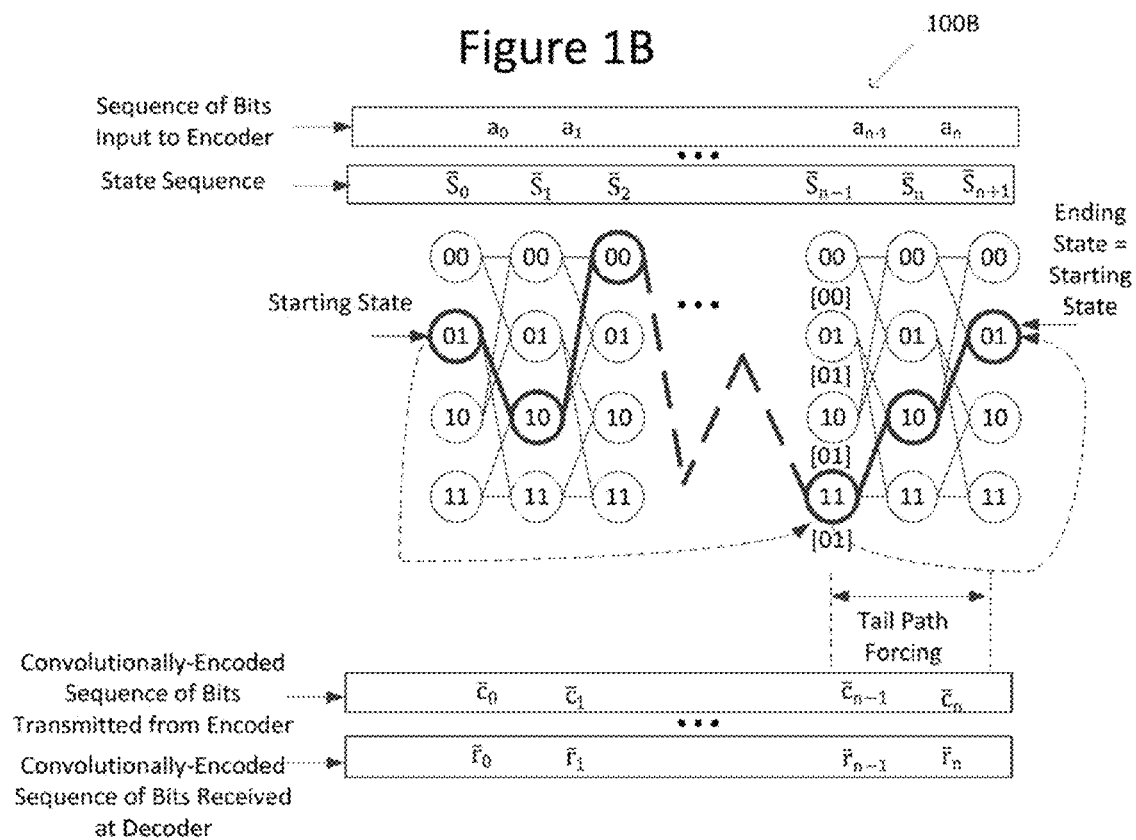
FIG. 1B illustrates a trellis representation of the convolutional decoder of FIG. 1A.

FIG. 1B illustrates a trellis representation of the convolutional decoder 100A of FIG. 1A. The m input bits cause a transition from a present state to a next state, and the number of output bits, i.e., code word bits, produced depends on the rate of the code. The transitions from one state to the next state when viewed as a function of time result in a graph commonly known as a "trellis." This trellis representation illustrated has a rate 1/3 convolutional code with a constraint length L=3; a constraint length is a number of bits used in the encoding process. This code includes four possible states, 00, 01, 10, 11, each corresponding to a group of v=2 bits and designated by one of four circles in each of an "old state" and "new state" column. The diagram shows all of the possible transitions between a given one of the old states and the new states that can be reached from the given old states. Since m=1 in this example, the encoding process dictates that there can be only two transitions out of a state and two transitions into a state. In general, for m input bits, in this case there are 2m transitions out of and into a state. The rate, constraint length number of states, etc. are merely examples; the disclosure is of course not limited in these respects.

The state assignment shown in FIG. 1B is arbitrary to some degree. The convention adopted in this example is that the input bit shifts into the least significant bit (LSB) of the shift register while the most significant bit (MSB) shifts out of the register. According to this convention, two states differing in the MSB converge onto the same state when an input is shifted into the LSB. For example, the 00 and 10 states both converge to the 00 state when a 0 is shifted into the LSB of the register.

The convolutional encoding/decoding process can be viewed as tracing a path through the trellis representation. FIG. 1B shows one such path traced through the four-state trellis as a function of time. The vertical axis denotes the state numbers in ascending order, and the horizontal axis represents time, with each stage of the trellis representing a period of time. Typically, the shift register is initialized to start at the 00 state. For each of the transitions shown in FIG. 1B of the encoder, n code bits are generated. Thus, the objective of the corresponding decoding process is to retrace this path through the trellis based on the received sequence of convolutionally-encoded input bits.

The convolutional decoder 100A is described herein as a Viterbi decoder, though the disclosure is not necessarily limited in this respect. When there is no knowledge or constraints on the initial and ending states of the convolutional code, that is, the convolutional code could start and end at any state, the Viterbi decoder is optimal in the sense that it minimizes the code word decoding error. A Tail Biting Convolutional Code (TBCC) is a convolutional code with an additional constraint on the initial and ending states of the code word trellis representation. Specifically, when the input to the convolutional encoder is $[a_0 a_1 \ldots a_{n-1} a_n]$, the initial state and the ending state corresponding to a TBCC code word $[\bar{c}_0 \bar{c}_1 \ldots \bar{c}_{n-1} \bar{c}_n]$ need to be the same, that is, $\bar{S}_{n+1} = \bar{S}_0$. This is illustrated in FIG. 1B, where each of the initial state $\bar{S}_0$ and the ending state $\bar{S}_{n+1}$ is 01.

Referring back to FIG. 1A, a convolutionally-encoded sequence of received bits $[\bar{r}_0 \bar{r}_1 \ldots \bar{r}_{n-1} \bar{r}_n]$ is applied to the branch metric unit 120 at input unit 110. The branch metric unit 120 is configured to determine branch metrics for respective transitions between states in the trellis representation of the convolutional code used to generate the convolutionally-encoded sequence of bits.

A branch metric is a normed distance between the bits of the convolutional code and the actually received bits. There are hard decision and soft decision Viterbi decoders. A hard decision Viterbi decoder uses as a metric known as a Hamming distance, which is the number of bits at which the corresponding sequences of bits are different. A strong match between the received convolutionally-encoded sequence of bits and a hypothesized code word of the convolutional code results in a smaller branch metric, whereas a weaker match between the received convolutionally-encoded sequence of bits and a hypothesized code word results in a larger branch metric. Alternatively, a soft decision Viterbi decoder receives a bit stream containing information about the reliability of the received bits, wherein generally a strong match between the received convolutionally-encoded sequence of bits and a hypothesized code word of the convolutional code results in a larger branch metric, whereas a weaker match between the received convolutionally-encoded sequence of bits and a hypothesized code word results in a smaller branch metric.

The path metric unit 130 is configured to determine, based on the branch metrics, path metrics corresponding to maximum likelihood survival paths reaching the respective states in the trellis representation. The path metric unit 130 includes an Add-Compare-Select (ACS) unit 132, which summarizes the individual branch metrics to obtain path metrics for respective paths, one of which will eventually be chosen as optimal as being the maximum likelihood path through the trellis representation. The ACS unit 132 is recursive since the new path metrics depend on the path metrics computed for the previous stage and the branch metric corresponding to the transition from the previous state to an ending state.

More specifically, at each time index k in the trellis, for each state, the ACS unit 132 computes and records the metric of the most likely path $\hat{t}_k$ originated from any state $\bar{S}_k$ that ended at state $\bar{S}_{k+1}$. The metric of the most likely path ending at state $\bar{S}_{k+1}$ is computed as follows:

$$M(\bar{S}_{k+1}) = \max_{\{t_k | t_k \text{ ends at } \bar{S}_{k+1}\}} \{M(\bar{S}_k(t_k)) + BM(\bar{r}_k, t_k)\}$$

where the maximization is over all possible paths $\{t_k\}$ that end at state $\bar{S}_{k+1}$. Here, $M(\bar{S}_k(t_k))$ is the metric corresponding to the starting state of path $\{t_k\}$, and $BM(\bar{r}_k, t_k)$ is the branch metric of path $\{t_k\}$. The Viterbi decoder also records the surviving path $\hat{t}_k$ of each state $\bar{S}_{k+1}$ to be used by the following step. In Viterbi decoding, the problem of exponential growth in the number of paths is solved by selecting, at each time step, one of two converging paths. As a result, the number of paths under consideration remains constant with time. This elimination of paths at each time step, i.e., at each trellis stage, is referred to as the ACS operation. The ACS operation is done in a recursive manner starting from k=0 to k=n.

A typical TBCC decoder will process the received code word sequence for multiple iterations ($S_0$ to $S_{n+1}$) to allow convergence and to obtain better decoding performance. Before the first iteration of the Viterbi algorithm, the state metrics are generally initialized to all zeroes for each of the states. The first iteration is performed from time index 0 through to n+1. After the first iteration is completed, instead of initializing the states to all zeroes again, the states are initialized with the previously accumulated state metrics from the first iteration, and then the second iteration is performed. The iterations are performed multiple times, normally until convergence, but practically not more than five or six times depending on the desired decoding quality.

The path metric unit 130 not only includes ACS unit 132, but additionally includes starting state unit 134. The starting state unit 134 is configured to store starting states for the respective maximum likelihood survival paths. At time index k, and for each state $S_{k+1}$, in addition to updating and storing the state metric $M(\bar{S}_{k+1})$, the starting state unit 134 records the starting state $\bar{S}_0$ of the survival path that reaches $\bar{S}_{k+1}$.

The tail path forcing unit 140 is configured to select a tail path of a maximum likelihood survival path at w states prior to its ending state in the trellis representation such that the ending state equals its stored starting state, where w is equal to a constraint length of the decoder minus one. More specifically, for each state $\bar{S}_{n-L+2}$, based on the stored starting state $\bar{S}_0$ as described above, the tail path forcing unit 140 is configured to select the "tail path" such that the survival path at state $\bar{S}_{n+1}$ satisfies $\bar{S}_{n+1} = \bar{S}_0$. Here, L is the constraint length of the TBCC.

After completing the tail path forcing operation, the output of the tail path forcing unit 140 is supplied to the trace back unit 150, which reconstructs the most likely survival path $\hat{t}_n$, corresponding to the most likely code word, recursively in a backward fashion starting from state $\bar{S}_{n+1}$ in order to reconstruct the sequence of input bits. This process is generally called the trace back operation.

FIG. 1C is a flowchart 100C illustrating an example of a method of performing convolutional decoding using the decoder 100A of FIG. 1A.

First, in Step 110C, a convolutionally-encoded sequence of bits is received the decoder input 110.

At Step 120C, the branch metric unit 120 determines branch metrics for respective transitions between states in a trellis representation of a convolutional code used to generate the convolutionally-encoded sequence of bits. This step of determining branch metrics may include using the Hamming distance, that is determining the branch metrics such that a strong match between the received convolutionally-encoded sequence of bits and a hypothesized code word of the convolutional code results in a smaller branch metric, and a weaker match between the received convolutionally-encoded sequence of bits and a hypothesized code word results in a larger branch metric. Alternatively, this step may include determining the branch metrics such that a strong match between the received convolutionally-encoded sequence of bits and a hypothesized code word of the convolutional code results in a larger branch metric, whereas a weaker match between the received convolutionally-encoded sequence of bits and a hypothesized code word results in a smaller branch metric.

Next, at Step 130C, the path metric unit 130 determines, based on the branch metrics, path metrics corresponding to maximum likelihood survival paths reaching the respective states in the trellis representation.

The starting state unit 134, at Step 134C, stores starting states for the respective maximum likelihood survival paths.

At Step 140C, tail path forcing unit 140 selects a tail path of a maximum likelihood survival path at w states prior to its ending state in the trellis representation such that its ending state equals its stored starting state, where w is equal to a constraint length of the decoder minus one.

Finally, at Step 150C Reconstructing the most likely path in a trace back operation This disclosure includes a computer program product embodied on a non-transitory computer-readable medium having program instructions configured such that when executed by processing circuitry cause the processing circuitry to implement this method described with respect to FIG. 1C.

Figure 1D:
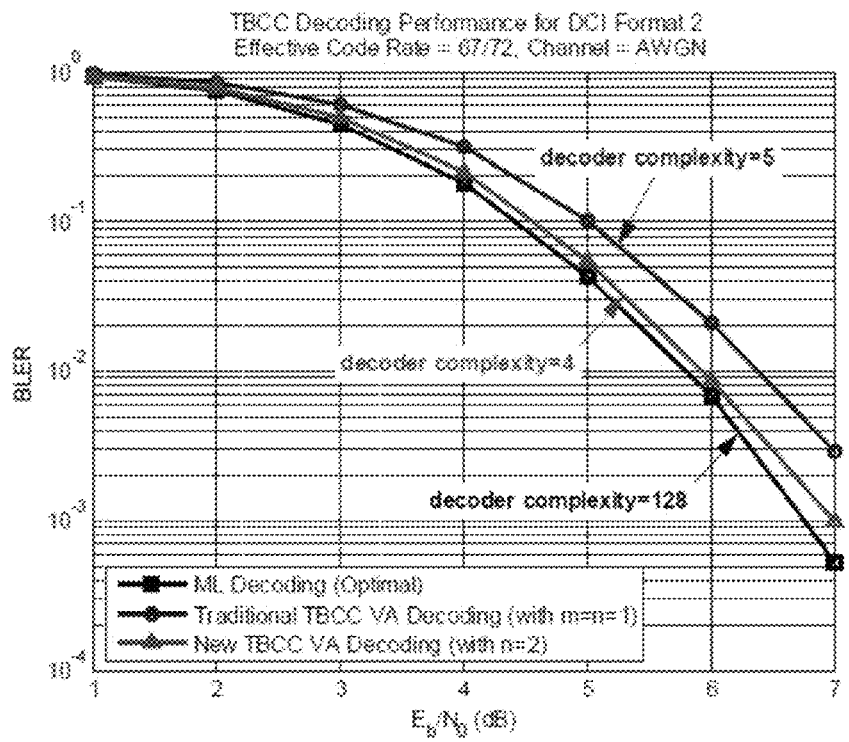
FIGS. 1D and 1E are graphs illustrating decoding performance of the convolutional decoder of FIG. 1A.
Figure 1E:
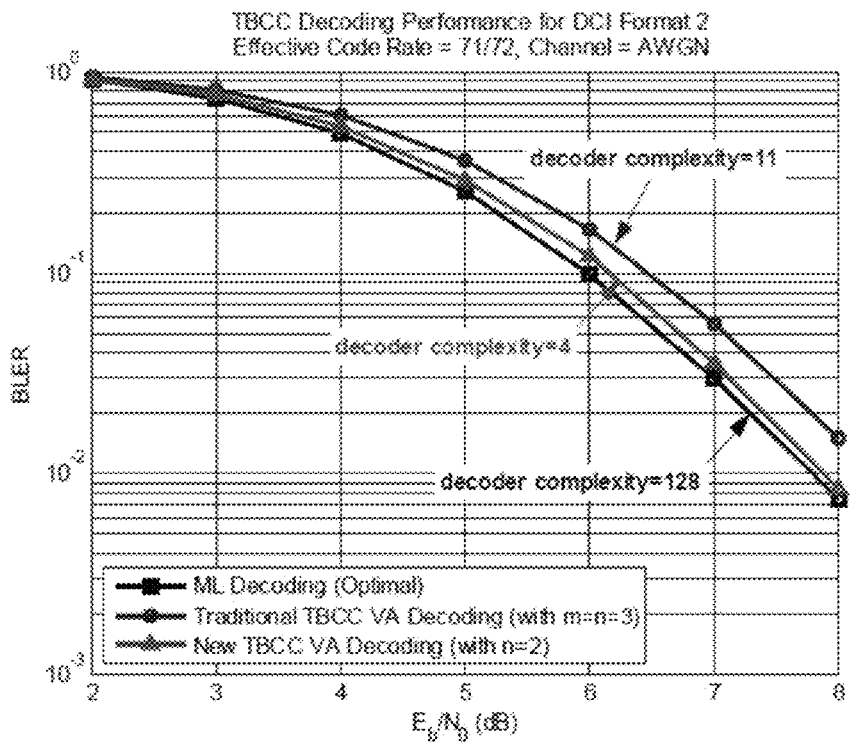

FIGS. 1D and 1E are graphs illustrating simulated decoding performances of the convolutional decoder 100A of FIG. 1A. FIG. 1D illustrates the decoding performance for rate 67/72 TBCC, and FIG. 1E illustrates the decoding performance for rate 71/72 TBCC. The vertical axes denote Block Error Rates (BLER), and the horizontal axes represent the energies per bit to noise power spectral density ration ($E_b/N_o$) in decibels.

The graphs compare the decoding performance between three different types of decoders: a traditional decoder, the decoder 100A described herein, and an optimal decoder. The optimal decider is provided only as a baseline for performance comparison, and is not a practical decoder due to its extremely high complexity.

As can be seen in FIG. 1D, performance-wise, the decoder 100A outperforms the traditional decoder by 0.5 dB, and is only less than 0.1 dB different from the optimal maximum likelihood decoding. Complexity-wise, the method 100C described herein has 20% less complexity as compared to the traditional decoder. Similar conclusions can be drawn from FIG. 1E as well, with even more complexity reduction, that is, 64% less complexity.

Figure 2A:
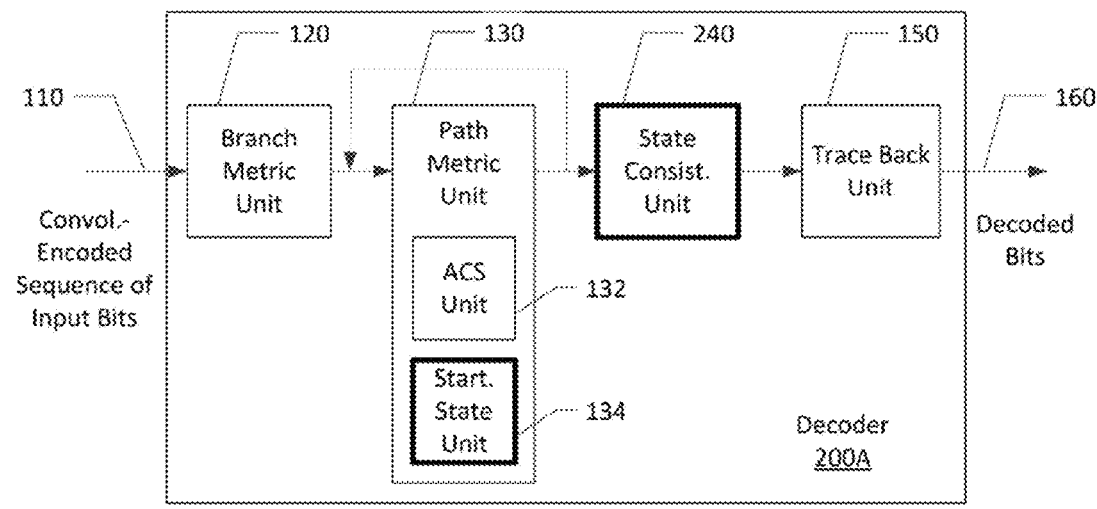
FIG. 2A illustrates a schematic diagram of another example of a convolutional decoder.

FIG. 2A illustrates a schematic diagram of another example of a convolutional decoder 200A. The convolutional decoder 200A includes an input 110, a branch metric unit 120, a path metric unit 130, a state consistency unit 240, and a trace back unit 150. The input 110, branch metric unit 120, path metric unit 130, and trace back unit 150 were described above with respect to FIG. 1A, and thus for the sake of brevity, their descriptions will not be repeated here. A main difference between decoder 100A of FIG. 1A and decoder 200A of FIG. 2A is that decoder 200A replaces tail path forcing unit 140 with state consistency unit 240.

By way of overview, the state consistency unit 240 determines whether at the end of a decoding iteration, an optimal survival path has been found. Once the survival optimal path has been found, there is no need to performing an additional iteration of the Viterbi algorithm through the trellis representation. The trace back unit 150 can immediately start the trace back process. This early termination scheme provides a significant reduction in decoding time and complexity, especially for a TBCC with a high code rate.

Figure 2B:
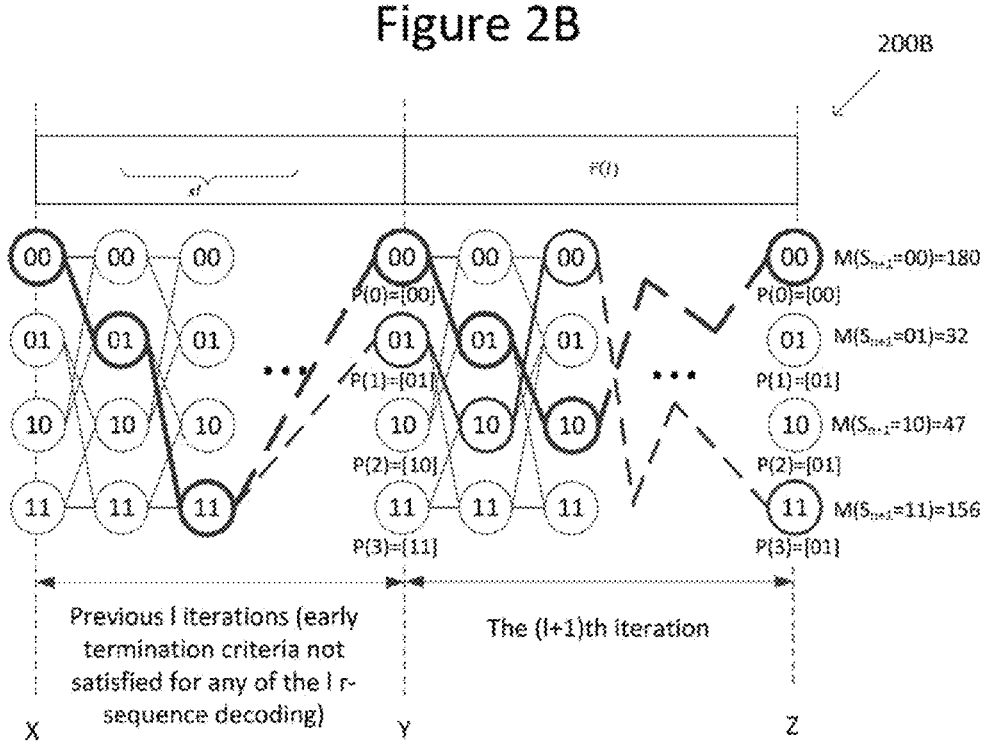
FIG. 2B illustrates a trellis representation of the convolutional decoder of FIG. 2A.

FIG. 2B illustrates a trellis representation of the convolutional decoder of FIG. 2A. The portion of the trellis representation between lines X and Y represent the iterations of the Viterbi process ($\bar{r}(0), \bar{r}(1), \ldots \bar{r}(l-1)$) prior to the early termination criteria being satisfied, whereas the portion between lines Y and Z represents the last iteration ($\bar{r}$) when the early termination criteria is satisfied.

As discussed above, the starting state unit 134 is configured to store starting states for the respective maximum likelihood survival paths. At time index k, and for each state $\bar{S}_{k+1}$, in addition to updating and storing the state metric $M(\bar{S}_{k+1})$, the starting state unit 134 records the starting state $S_0$ of the survival path that reaches $\bar{S}_{k+1}$, denoted by $P(\bar{S}_{k+1})$.

Memory registers, P(0), P(1), P(2), P(3), store respective survival path starting states $\bar{S}_0$. The Viterbi algorithm is processed all the way through to ending state $S_{n+1}$, then for each ending state 00, 01, 10, 11, there is one survival path. Each survival path has a respective, stored starting state (P(0), P(1), P(2), P(3)). For example, the survival path at time index n+1 ending at state 00 is has a stored starting state of 00 (P(0)= [00]). Similarly, the survival path ending at state 11 has a stored starting state of 11 (P(3)=[01]).

The Viterbi algorithm, as part of the ACS operation performed by ACS unit 132 selects the maximum likelihood survival path of the four possible paths. For each state 00, 01, 10, 11, there is a survival path, and the one with the maximum likelihood is selected. More specifically, the ACS unit 132 determines at time index n+1, which state $\bar{S}_{n+1}$=q has a state metric M(q) that indicates the maximum likelihood path among $\{M(i)|i=0, 1, \ldots, 2^{L-1}-1\}$. This selection is accomplished by comparing the path metrics 180, 32, 47, and 156. In this case the path metrics represent soft decisions as discussed above, so the larger the path metric is the higher the likelihood the path is the maximum likelihood survival path. In this example state 00 has the largest path metric, 180, so the path ending at this state is the maximum likelihood survival path.

The state consistency unit 240 is configured to determine, at the end of each iteration, whether the maximum likelihood survival path has an ending state in the trellis representation that is equivalent to its stored starting state, as require by TBCCs. If the determination is negative, that is, $P(\bar{S}_{n+1}=q) \neq q$, the ACS unit 132 is configured to perform on the received convolutionally-encoded sequence of bits $\bar{r}$ an additional iteration of the Viterbi algorithm until early termination is triggered or until the maximum allowed number of iterations is reached; one example of the maximum number of iterations may be three. On the other hand, if the determination by the state consistency unit 240 is positive, that is, if $P(\bar{S}_{n+1}=q)=q$, then the best path is found. The ACS unit 132 is configured to end determining the branch and path metrics through the trellis representation as no further iterations of the Viterbi algorithm are needed, and the trace back unit 150 can begin tracing back from state $\overline{S}_{n+1}=q$.

Once the best path is found at the end of a Viterbi algorithm iteration, even if the decoding process is not terminated early and further iterations are performed, the resulting maximum likelihood path would still be the same, there is no performance gain for performing additional iterations. The survival path is in fact the maximum likelihood survival path as the stored starting state equals the ending state.

FIG. 2C is a flowchart 200C illustrating an example of a method of performing convolutional decoding using the decoder 200A of FIG. 2A.

Steps 110C, 120C, 130C, and 134C were described above with respect to FIG. 1C, and thus there descriptions will not be repeated here.

In Step 240C, the state consistency unit 240 determines whether a maximum likelihood survival path has an ending state in the trellis representation that is equivalent to its stored starting state.

If the determination by the state consistency unit 240 is positive, at Step 244C the determinations of the branch and path metrics through the trellis representation is ended, and then the trace back unit 150 can begin tracing back the maximum likelihood path. Step 150C was described above with respect to FIG. 1C, and thus its description will not be repeated here. Alternatively, if the determination by the state consistency unit 240 is negative, at Step 2424C the received convolutionally-encoded sequence of bits is processed for an additional iteration through the trellis representation.

This disclosure also includes a computer program product embodied on a non-transitory computer-readable medium having program instructions configured such that when executed by processing circuitry cause the processing circuitry to implement this method described with respect to FIG. 2C.

Figure 2D:
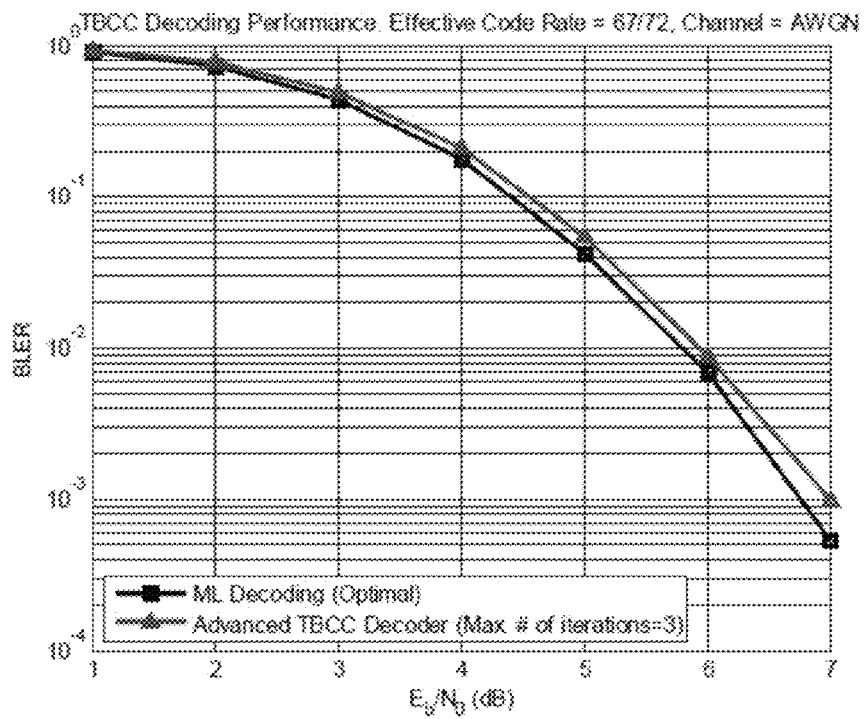
FIGS. 2D though 2G are graphs illustrating decoding performance and complexity of the convolutional decoder of FIG. 2A.
Figure 2E:
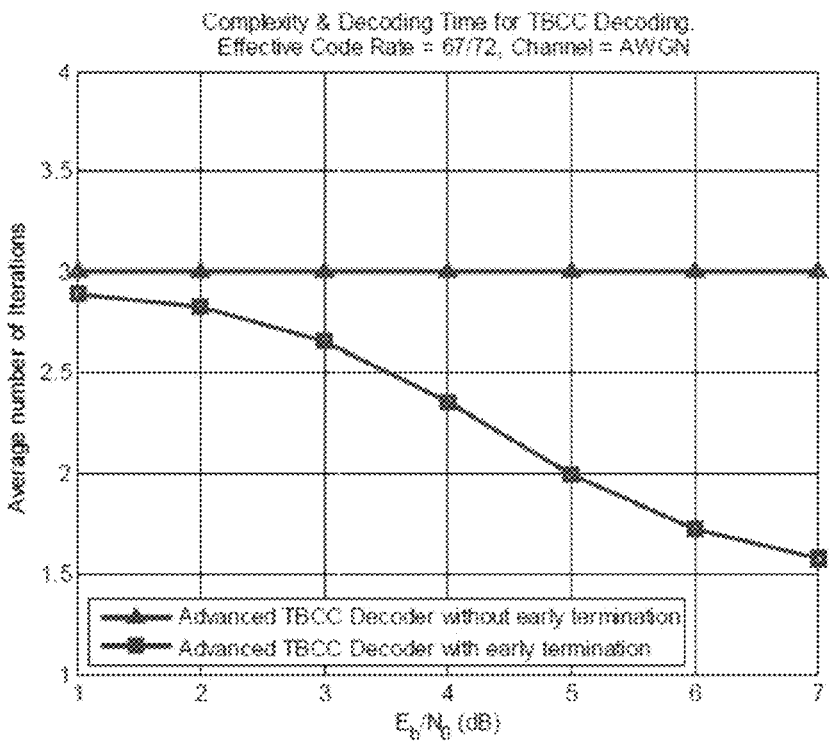
FIG. 2C is a flowchart illustrating an example of a method of decoding a convolutionally-encoded sequence of bits using the decoder of FIG. 2A.
Figure 2F:
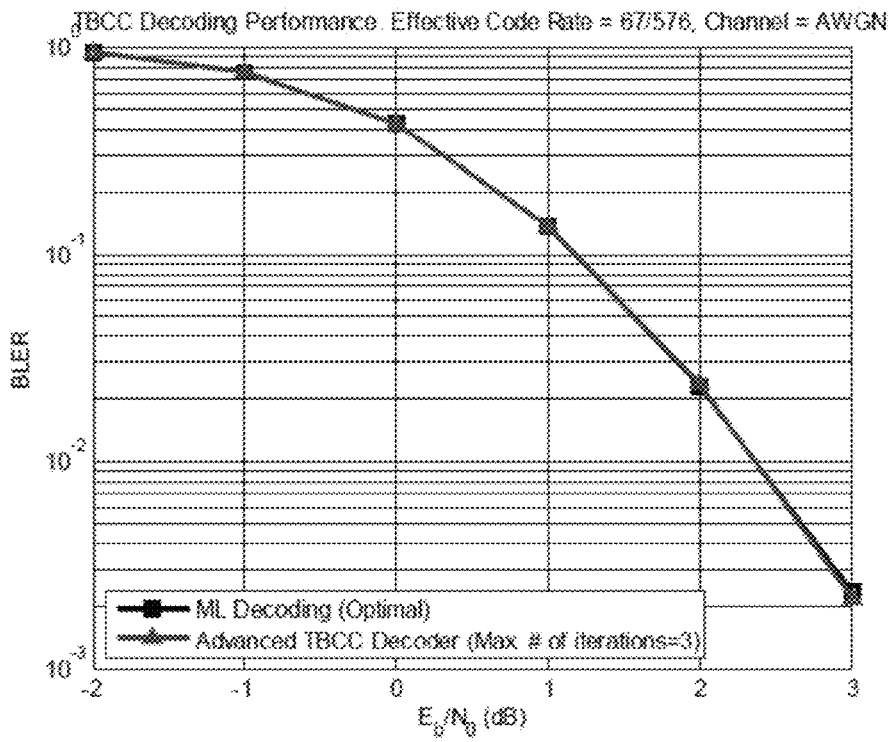
Figure 2G:
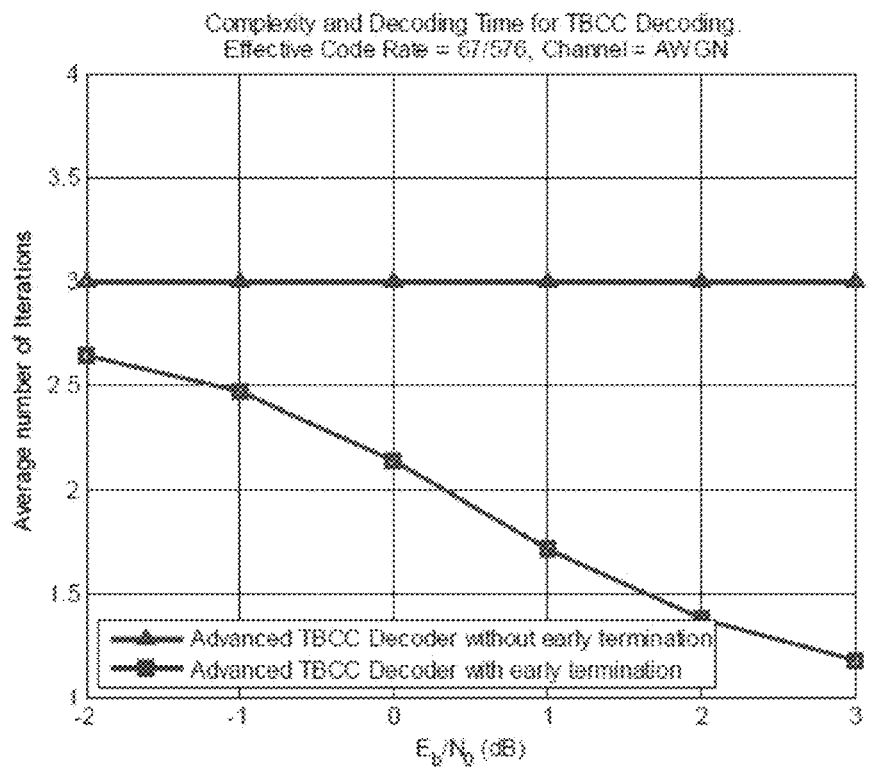

FIGS. 2D though 2G are graphs illustrating decoding performance of the convolutional decoder of FIG. 2A. FIGS. 2D and 2F illustrate the performance of the decoder 200A as compared to an optimal decoder for different code rates; the vertical axes denote Block Error Rate (BLER), and the horizontal axes represent the energy per bit to noise power spectral density ratio ($E_b/N_o$) in decibels. FIGS. 2E and 2G illustrate the corresponding complexity and decoding time reduction achieved with the method 200C described with respect to FIG. 2C; the vertical axes denote the average number of iterations, and the horizontal axes represents the energy per bit to noise power spectral density ratio ($E_b/N_o$) in decibels.

FIG. 2D illustrates the decoding performance of the decoder 200A for rate 67/72 TBCC. FIG. 2E illustrates the complexity and decoding time for rate 71/72 TBCC. FIG. 2F illustrates the decoding performance of the TBCC decoder 200A for rate 67/576 TBCC. FIG. 2G illustrates the complexity and decoding time for rate 71/576 TBCC.

As can be seen from these figures, the decoding performance is the same with or without early termination. From these figures, it can be seen that in the normal operating point (e.g., BLER=$10^{-2}$), there is approximately 43% decoding complexity reduction for a TBCC rate equal to 67/72, which is a high code rate condition, and approximately a 57% decoding complexity reduction for a TBCC rate equal to 67/576, which is a low code rate condition. It can thus bee seen that the early termination method 200C described with respect to FIG. 2C provides a significant reduction in decoding complexity without compromising decoding performance.

Figure 3:
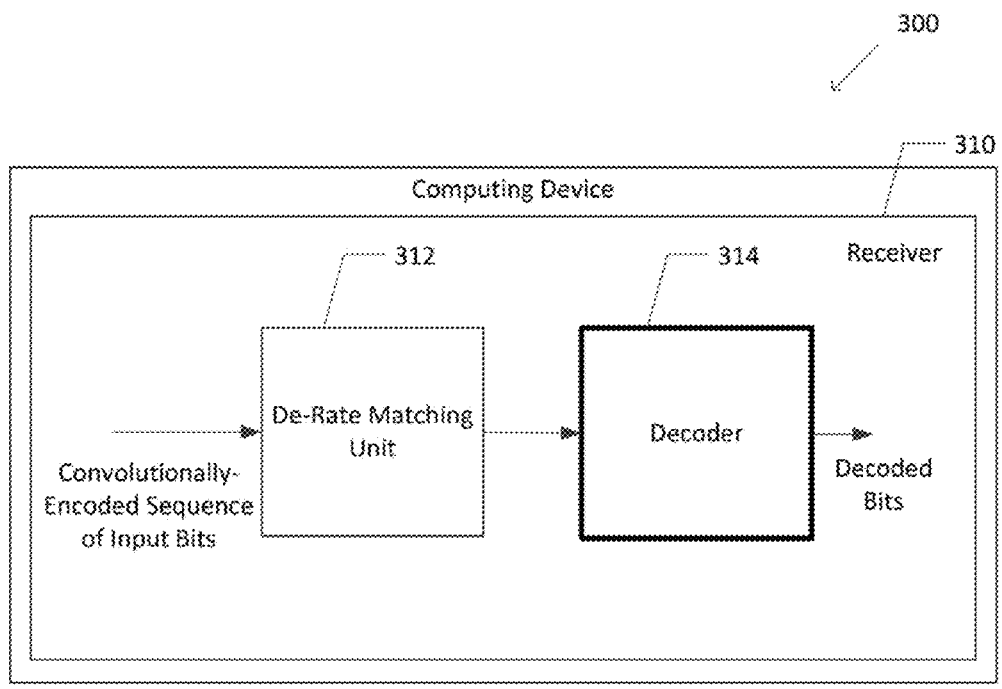
FIG. 3 illustrates a schematic diagram of a computing device having the convolutional decoder of FIG. 1A or 2A.

FIG. 3 illustrates a schematic diagram of a computing device 300 having a receiver 310 including the convolutional decoder 314 of FIG. 1A or 2A. This computing device 300 may be a wireless communication device, such as a base station or a handheld mobile device.

The computing device also includes a de-rate matching unit 312, which as the name implies, in the inverse of a rate matching unit of an encoder. A rate matching unit is also known as a puncturing unit. Puncturing, as is known, increases a transmission rate by deleting certain bits out of a code word to be output by an encoder according to a puncturing matrix. The de-rate matching unit 312 takes the puncturing by the encoder into consideration.

The convolutional decoders 100A, 200A, and its corresponding methods 100C, 200C, described herein are advantageous in numerous respects. The convolutional decoders 100A 200A and methods 100C, 200C more often output a valid TBCC code word. Moreover, when operating at high code rates, the decoders 100A, 200A converge much more quickly to the correct maximum likelihood survival path, leading to significant reduction in both complexity and decoding time.

Example 1 is a decoder comprising an input configured to receive an encoded sequence of bits; a branch metric unit configured to determine a plurality of branch metrics for a plurality of respective transitions between a plurality of states in a trellis representation of a code used to generate the encoded sequence of bits; a path metric unit configured to determine, based on the branch metrics, a plurality of path metrics corresponding to a plurality of maximum likelihood survival paths reaching the plurality of respective states in the trellis representation; a starting state unit configured to store starting states for the respective maximum likelihood survival paths; and a tail path forcing unit configured to select a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one.

In Example 2, the subject matter of Example 1, wherein the decoder is a tail biting convolutional decoder (TBCC) in which the starting and ending states of the maximum likelihood survival path are equivalent.

In Example 3, the subject matter of Example 1, wherein the path metric unit comprises an add-compare-select unit.

In Example 4, the subject matter of Example 1, wherein the branch metric unit is further configured to determine the branch metrics such that a strong match between the received encoded sequence of bits and a hypothesized code word of the code results in a smaller branch metric, whereas a weaker match between the received encoded sequence of bits and a hypothesized code word results in a larger branch metric.

In Example 5, the subject matter of Example 1, wherein the branch metric unit is further configured to determine the branch metrics based on a Hamming distance between the received encoded sequence of bits and the hypothesized code word of the code.

In Example 6, the subject matter of Example 1, wherein the branch metric unit is further configured to determine the branch metrics such that a strong match between the received encoded sequence of bits and a hypothesized code word of the code results in a larger branch metric, whereas a weaker match between the received encoded sequence of bits and a hypothesized code word results in a smaller branch metric.

In Example 7, the subject matter of Example 1, wherein the decoder is a Viterbi decoder.

In Example 8, a computing device comprising the subject matter of Example 1.

Example 9 is a method of decoding an encoded sequence of bits, the method comprising receiving, at an input, the encoded sequence of bits; determining, by a branch metric unit, a plurality of branch metrics for a plurality of respective transitions between a plurality of states in a trellis representation of a code used to generate the encoded sequence of bits; determining, by a path metric unit and based on the branch metrics, a plurality of path metrics corresponding to a plurality of maximum likelihood survival paths reaching the respective states in the trellis representation; storing, by a starting state unit, a plurality of starting states for the plurality of respective maximum likelihood survival paths; and selecting, by a tail path forcing unit, a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one.

In Example 10, the subject matter of Example 9, wherein the step of determining branch metrics further comprises determining the branch metrics such that a strong match between the received encoded sequence of bits and a hypothesized code word of the code results in a smaller branch metric, and a weaker match between the received encoded sequence of bits and a hypothesized code word results in a larger branch metric.

Example 11 is a computer program product embodied on a non-transitory computer-readable medium comprising program instructions configured such that when executed by processing circuitry cause the processing circuitry to implement the subject matter of Example 9.

Example 12 is a decoder, comprising an input means for receiving an encoded sequence of bits; a branch metric means for determining a plurality of branch metrics for a plurality of respective transitions between a plurality of states in a trellis representation of a code used to generate the encoded sequence of bits; a path metric means for determining, based on the branch metrics, a plurality of path metrics corresponding to a plurality of maximum likelihood survival paths reaching the respective states in the trellis representation; a starting state means for storing a plurality of starting states for the plurality of respective maximum likelihood survival paths; and a tail path forcing means for selecting a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one.

Example 13 is a decoder comprising an input configured to receive an encoded sequence of bits; a branch metric unit configured to determine a plurality of branch metrics for a plurality of respective transitions between a plurality of states in a trellis representation of a code used to generate the encoded sequence of bits; a path metric unit configured to determine, based on the branch metrics, a plurality of path metrics corresponding to a plurality of maximum likelihood survival paths reaching the plurality of respective states in the trellis representation; a starting state unit configured to store a plurality of starting states for the plurality of respective maximum likelihood survival paths; and a state consistency unit configured to determine whether a maximum likelihood survival path has an ending state in the trellis representation that is equivalent to its stored starting state, wherein if the state consistency unit's determination is positive, the branch metric unit and path metric units are configured to end the determinations of the branch and path metrics.

In Example 14, the subject matter of Example 13, wherein if the state consistency unit's determination is negative, the decoder is configured to process the received encoded sequence of bits for an additional iteration through the trellis representation.

In Example 15, the subject matter of Example 14, wherein the decoder is configured to end processing of the received encoded sequence of bits through the trellis representation after a predetermined number of iterations through the trellis representation.

In Example 16, the subject matter of Example 13, wherein the decoder is a tail biting convolutional decoder (TBCC) in which the starting and ending states of the maximum likelihood survival path are equivalent.

In Example 17, the subject matter of Example 13, wherein the path metric unit comprises an add-compare-select unit.

In Example 18, the subject matter of Example 13, wherein the branch metric unit is further configured to determine the branch metrics such that a strong match between the received encoded sequence of bits and a hypothesized code word of the code results in a smaller branch metric, whereas a weaker match between the received encoded sequence of bits and a hypothesized code word results in a larger branch metric.

In Example 19, the subject matter of Example 13, wherein the branch metric unit is further configured to determine the branch metrics such that a strong match between the received encoded sequence of bits and a hypothesized code word of the code results in a larger branch metric, whereas a weaker match between the received encoded sequence of bits and a hypothesized code word results in a smaller branch metric.

In Example 20, the subject matter of Example 13, wherein the decoder is a Viterbi decoder.

Example 21 is a wireless communication device comprising the decoder of Example 13.

Example 22 is a computing device comprising the decoder of Example 13.

Example 23 is a method of decoding an encoded sequence of bits, the method comprising receiving, at an input, the encoded sequence of bits; determining, by a branch metric unit, branch metrics for respective transitions between states in a trellis representation of a code used to generate the encoded sequence of bits; determining, by a path metric unit and based on the branch metrics, path metrics corresponding to maximum likelihood survival paths reaching the respective states in the trellis representation; storing, by a starting state unit, starting states for the respective maximum likelihood survival paths; and determining, by a state consistency unit, whether a maximum likelihood survival path has an ending state in the trellis representation that is equivalent to its stored starting state, wherein if the determination by the state consistency unit is positive, ending the determinations of the branch and path metrics.

In Example 24, the subject matter of Example 23, wherein if the determination by the state consistency unit is negative, processing the received encoded sequence of bits for an additional iteration through the trellis representation.

Example 25 is a computer program product embodied on a non-transitory computer-readable medium comprising program instructions configured such that when executed by processing circuitry cause the processing circuitry to implement the method of Example 23.

In Example 26, the subject matter of any of Examples 1-2, wherein the path metric unit comprises an add-compare-select unit.

In Example 27, the subject matter of any of Examples 1-3, wherein the branch metric unit is further configured to determine the branch metrics such that a strong match between the received encoded sequence of bits and a hypothesized code word of the code results in a smaller branch metric, whereas a weaker match between the received encoded sequence of bits and a hypothesized code word results in a larger branch metric.

In Example 28, the subject matter of any of Examples 1-4, wherein the branch metric unit is further configured to determine the branch metrics based on a Hamming distance between the received encoded sequence of bits and the hypothesized code word of the code.

In Example 29, the subject matter of any of Examples 1-5, wherein the branch metric unit is further configured to determine the branch metrics such that a strong match between the received encoded sequence of bits and a hypothesized code word of the code results in a larger branch metric, whereas a weaker match between the received encoded sequence of bits and a hypothesized code word results in a smaller branch metric.

In Example 30, the subject matter of any of Examples 1-6, wherein the decoder is a Viterbi decoder.

Example 31 is a computing device comprising the decoder of any of Examples 1-7.

Example 32 is a computer program product embodied on a non-transitory computer-readable medium comprising program instructions configured such that when executed by processing circuitry cause the processing circuitry to implement the method of any of Examples 9-10.

Example 33 is a decoder, comprising an input means for receiving an encoded sequence of bits; a branch metric means for determining branch metrics for respective transitions between states in a trellis representation of a code used to generate the encoded sequence of bits; a path metric means for determining, based on the branch metrics, path metrics corresponding to maximum likelihood survival paths reaching the respective states in the trellis representation; a starting state means for storing starting states for the respective maximum likelihood survival paths; and a state consistency means for determining whether a maximum likelihood survival path has an ending state in the trellis representation that is equivalent to its stored starting state, wherein if the state consistency unit's determination is positive, the branch metric unit and path metric units are configured to end the determinations of the branch and path metrics.

In Example 34, the subject matter of any of Examples 13-15, wherein the decoder is a tail biting convolutional decoder (TBCC) in which the starting and ending states of the maximum likelihood survival path are equivalent.

In Example 35, the subject matter of any of Examples 13-16, wherein the path metric unit comprises an add-compare-select unit.

In Example 36, the subject matter of any of Examples 13-17, wherein the branch metric unit is further configured to determine the branch metrics such that a strong match between the received encoded sequence of bits and a hypothesized code word of the code results in a smaller branch metric, whereas a weaker match between the received encoded sequence of bits and a hypothesized code word results in a larger branch metric.

In Example 37, the subject matter of any of Examples 13-18, wherein the branch metric unit is further configured to determine the branch metrics such that a strong match between the received encoded sequence of bits and a hypothesized code word of the code results in a larger branch metric, whereas a weaker match between the received encoded sequence of bits and a hypothesized code word results in a smaller branch metric.

In Example 38, the subject matter of any of Examples 13-19, wherein the decoder is a Viterbi decoder.

Example 39 is a wireless communication device comprising the decoder of any of Examples 13-20.

Example 40 is a computing device comprising the decoder of any of Examples 13-20.

Example 41 is a computer program product embodied on a non-transitory computer-readable medium comprising program instructions configured such that when executed by processing circuitry cause the processing circuitry to implement the method of any of Examples 23-24.

Example 42 is an apparatus substantially as shown and described.

Example 43 is a method substantially as shown and described.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

The invention claimed is:

1. A decoder, comprising:
   an input configured to receive an encoded sequence of bits;
   a branch metric unit configured to determine a plurality of branch metrics for a plurality of respective transitions between a plurality of states in a trellis representation of a code used to generate the encoded sequence of bits;
   a path metric unit configured to determine, based on the plurality of branch metrics, path metrics corresponding to a plurality of maximum likelihood survival paths reaching the plurality of respective states in the trellis representation;
   a starting state unit configured to store a plurality of starting states for the plurality of respective maximum likelihood survival paths; and
   a tail path forcing unit configured to select a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one.

2. The decoder of claim 1, wherein the decoder is a tail biting convolutional decoder (TBCC) in which the starting and ending states of the maximum likelihood survival path are equivalent.

3. The decoder of claim 1, wherein the path metric unit comprises an add-compare-select unit.

4. The decoder of claim 1, wherein the branch metric unit is further configured to determine the branch metrics such that a size of a branch metric is inversely proportional to a strength of a match between the received encoded sequence of bits and a hypothesized code word of code.

5. The decoder of claim 4, wherein the branch metric unit is further configured to determine the branch metrics based on a Hamming distance between the received encoded sequence of bits and the hypothesized code word of the code.

6. The decoder of claim 1, wherein the branch metric unit is further configured to determine the branch metrics such that a size of a branch metric is directly proportional of a strength of a match between the received encoded sequence of bits and a hypothesized code word of code results.

7. The decoder of claim 1, wherein the decoder is a Viterbi decoder.

8. A computing device comprising the decoder of claim 1.

9. A method of decoding an encoded sequence of bits, the method comprising:
receiving, at an input, the encoded sequence of bits;
determining, by a branch metric unit, a plurality of branch metrics for a plurality of respective transitions between a plurality of states in a trellis representation of a code used to generate the encoded sequence of bits;
determining, by a path metric unit and based on the plurality of branch metrics, path metrics corresponding to the plurality of maximum likelihood survival paths reaching the respective states in the trellis representation;
storing, by a starting state unit, a plurality of starting states for the plurality of respective maximum likelihood survival paths; and
selecting, by a tail path forcing unit, a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one.

10. The method of claim 9, wherein the step of determining branch metrics further comprises determining the branch metrics such that a size of a branch metric is inversely proportional to a strength of a match between the received encoded sequence of bits and a hypothesized code word of code.

11. A computer program product embodied on a non-transitory computer-readable medium comprising program instructions configured such that when executed by processing circuitry cause the processing circuitry to implement the method of claim 9.

12. A decoder, comprising:
an input means for receiving a encoded sequence of bits;
a branch metric means for determining a plurality of branch metrics for a plurality of respective transitions between a plurality of states in a trellis representation of a code used to generate the encoded sequence of bits;
a path metric means for determining, based on the plurality of branch metrics, path metrics corresponding to a plurality of maximum likelihood survival paths reaching the plurality of respective states in the trellis representation;
a starting state means for storing a plurality of starting states for the respective maximum likelihood survival paths; and
a tail path forcing means for selecting a tail path of a maximum likelihood survival path at a w number of states prior to this maximum likelihood survival path's ending state in the trellis representation to result in this maximum likelihood survival path's stored starting and ending states being the same, wherein w is equal to a constraint length of the decoder minus one.

* * * * *